(12) United States Patent
Merrill et al.

(10) Patent No.: US 6,410,899 B1
(45) Date of Patent: Jun. 25, 2002

(54) ACTIVE PIXEL SENSOR WITH BOOTSTRAP AMPLIFICATION AND REDUCED LEAKAGE DURING READOUT

(75) Inventors: Richard B. Merrill, Woodside; Richard M. Turner, Menlo Park; Milton B. Dong, Saratoga; Richard F. Lyon, Los Altos, all of CA (US)

(73) Assignee: Foveon, Inc., Santa Clara, CA (US)

( * ) Notice: Subject to any disclaimer, the term of this patent is extended or adjusted under 35 U.S.C. 154(b) by 0 days.

(21) Appl. No.: 09/492,103

(22) Filed: Feb. 14, 2000

Related U.S. Application Data

(63) Continuation-in-part of application No. 09/099,116, filed on Jun. 17, 1998, now Pat. No. 6,097,022.

(51) Int. Cl.[7] .............................................. H04N 3/14
(52) U.S. Cl. .................................... 250/208.1; 348/308
(58) Field of Search .......................... 250/208.1, 214.1; 257/291, 292, 443, 444; 348/300, 301, 302, 308, 311

(56) References Cited

U.S. PATENT DOCUMENTS

| | | | |
|---|---|---|---|
| 3,866,067 A | 2/1975 | Amelio | 307/311 |
| 3,934,161 A | 1/1976 | Caywood | 307/311 |
| 3,971,065 A | 7/1976 | Bayer | 358/41 |
| 3,988,619 A | 10/1976 | Malaviya et al. | 307/311 |
| 4,011,016 A | 3/1977 | Layne et al. | 356/195 |
| 4,236,760 A | 12/1980 | Haar et al. | 303/6 C |
| 4,238,760 A | 12/1980 | Carr | 357/30 |
| 4,309,604 A | 1/1982 | Yoshikawa et al. | 250/226 |
| 4,363,963 A | 12/1982 | Ando | 250/211 |
| 4,395,736 A | 7/1983 | Fraleux | 358/213 |
| 4,473,836 A | 9/1984 | Chamberlain | 357/30 |
| 4,499,529 A | 2/1985 | Figueroa | 362/283 |
| 4,499,590 A | 2/1985 | Bluzer | 377/60 |

(List continued on next page.)

FOREIGN PATENT DOCUMENTS

| | | | |
|---|---|---|---|
| DE | 43 04 506 A1 | 8/1994 | H04N/5/225 |
| DE | WO 98/19455 | 5/1998 | H04N/3/15 |
| DE | 19836356 A1 | 8/1998 | H01L/27/146 |

(List continued on next page.)

OTHER PUBLICATIONS

Abbas El Gamal, et al. "Modeling and Estimation of FPN Components in CMOS Image Sensors", Information Systems Laboratory, Stanford University, and Fudan University, Shanghai, China, pp. 1–10,(sometime after 1/98).

(List continued on next page.)

*Primary Examiner*—Stephone B Allen
(74) *Attorney, Agent, or Firm*—Sierra Patent Group, Ltd.

(57) ABSTRACT

An integrated active pixel sensor array comprises a plurality of row select lines, each of said row select lines coupled to a source of a row-select signal; a plurality of source-follower drain row lines, each of said source-follower drain row lines coupled to a source of a source-follower drain row signal; a plurality of column output lines; a reset line coupled to a source of a reset signal; a source of reset potential; and a plurality of active pixel sensors, each pixel sensor associated with one row and one column of the array and including a photodiode having a first terminal coupled to a first reference potential and a second terminal, a Reset transistor having a gate coupled to the reset line, a drain coupled to the reset potential to reverse bias the photodiode, and a source coupled to the second terminal of the photodiode, a Source-Follower transistor having a gate coupled to the second terminal of the photodiode, a drain connected to the one of the plurality of source-follower drain row lines with which its active pixel sensor is associated, and a source, a Row-select transistor having a gate coupled to the one of the plurality of row-select lines with which its active pixel sensor is associated, a drain coupled to the source of the Source-follower transistor, and a source coupled to the one of the plurality of column output lines with which its active pixel sensor is associated.

6 Claims, 7 Drawing Sheets

U.S. PATENT DOCUMENTS

| | | | |
|---|---|---|---|
| 4,573,077 A | 2/1986 | Imai | 358/212 |
| 4,613,895 A | 9/1986 | Burkey et al. | 358/41 |
| 4,626,915 A | 12/1986 | Takatsu | 358/213 |
| 4,651,001 A | 3/1987 | Harada et al. | 250/330 |
| 4,654,714 A | 3/1987 | Hurst, Jr. et al. | 358/213 |
| 4,677,289 A | 6/1987 | Nozaki et al. | 250/226 |
| 4,704,633 A | 11/1987 | Matsumoto | 358/213.27 |
| 4,734,776 A | 3/1988 | Wang et al. | 358/213.31 |
| 4,742,238 A | 5/1988 | Sato | 250/578 |
| 4,786,818 A | 11/1988 | Mead et al. | 250/578 |
| 4,809,075 A | 2/1989 | Akimoto et al. | 358/213.18 |
| 4,839,735 A | 6/1989 | Kyomasu et al. | 358/213.31 |
| 4,845,553 A | 7/1989 | Konomura et al. | 358/98 |
| 4,875,091 A | 10/1989 | Yamada et al. | 358/42 |
| 4,901,129 A | 2/1990 | Hynecek | 357/30 |
| 4,908,651 A | 3/1990 | Fujino et al. | 354/434 |
| 4,942,473 A | 7/1990 | Zeevi et al. | 358/213.26 |
| 5,014,107 A | 5/1991 | Vora | 357/44 |
| 5,021,853 A | 6/1991 | Mistry | 357/23.13 |
| 5,038,214 A | 8/1991 | Miida | 358/213.11 |
| 5,055,418 A | 10/1991 | Vora | 437/31 |
| 5,117,292 A | 5/1992 | Matsunaga | 358/213.19 |
| 5,161,024 A | 11/1992 | Oishi | 358/213.24 |
| 5,227,887 A | 7/1993 | Dohi et al. | 358/213.27 |
| 5,241,575 A | 8/1993 | Miyatake et al. | 377/60 |
| 5,276,521 A | 1/1994 | Mori | 358/213.31 |
| 5,289,023 A | 2/1994 | Mead | 257/291 |
| 5,317,174 A | 5/1994 | Hynecek | 257/222 |
| 5,335,015 A | 8/1994 | Cooper et al. | 348/302 |
| 5,341,008 A | 8/1994 | Hynecek | 257/231 |
| 5,355,165 A | 10/1994 | Kosonocky et al. | 348/311 |
| 5,396,289 A | 3/1995 | Nakamura | 348/294 |
| 5,397,734 A | 3/1995 | Iguchi et al. | 437/70 |
| 5,414,464 A | 5/1995 | Sasaki | 348/222 |
| 5,414,465 A | 5/1995 | Kodama et al. | 348/236 |
| 5,414,683 A | 5/1995 | Tani | 369/47 |
| 5,424,223 A | 6/1995 | Hynecek | 437/3 |
| 5,428,390 A | 6/1995 | Cooper et al. | 348/240 |
| 5,434,620 A | 7/1995 | Higuchi et al. | 348/308 |
| 5,461,425 A | 10/1995 | Fowler et al. | 348/294 |
| 5,471,245 A | 11/1995 | Cooper et al. | 348/302 |
| 5,502,299 A | 3/1996 | Standley | 250/208.2 |
| 5,541,402 A | 7/1996 | Ackland et al. | 250/208.1 |
| 5,541,654 A | 7/1996 | Roberts | 348/301 |
| 5,547,881 A | 8/1996 | Wang et al. | 437/24 |
| 5,572,074 A | 11/1996 | Standley | 307/117 |
| 5,576,763 A | 11/1996 | Ackland et al. | 348/308 |
| 5,589,423 A | 12/1996 | White et al. | 437/228 |
| 5,625,210 A | 4/1997 | Lee et al. | 257/292 |
| 5,631,704 A | 5/1997 | Dickinson et al. | 348/308 |
| 5,668,596 A | 9/1997 | Vogel | 348/222 |
| 5,705,441 A | 1/1998 | Wang et al. | 438/384 |
| 5,712,682 A | 1/1998 | Hannah | 348/255 |
| 5,739,562 A | 4/1998 | Ackland et al. | 257/291 |
| 5,742,058 A | 4/1998 | Pantigny et al. | 250/370.08 |
| 5,801,657 A | 9/1998 | Fowler et al. | 341/155 |
| 5,883,421 A | 3/1999 | Chouikha et al. | 257/461 |
| 5,949,061 A | 9/1999 | Guidash et al. | 250/208.1 |
| 6,078,037 A | 6/2000 | Booth, Jr. | 250/208.1 |
| 6,097,022 A * | 8/2000 | Merrill et al. | 250/208.1 |
| 6,115,066 A | 9/2000 | Gowda et al. | 348/308 |
| 6,211,510 B1 | 4/2001 | Merrill et al. | 250/208.1 |

FOREIGN PATENT DOCUMENTS

| | | | |
|---|---|---|---|
| DE | 198 36 356 A1 | 5/1999 | H01L/27/146 |
| EP | 62143571 | 6/1987 | H04N/5/335 |
| EP | 01103378 | 4/1989 | H04N/5/335 |
| EP | 0 466 929 A1 | 1/1992 | H04N/5/238 |
| EP | 0605898 A1 | 12/1993 | H01L/27/146 |
| EP | 06133320 | 5/1994 | H04N/9/09 |
| EP | 0 605 898 A1 | 7/1994 | H01L/27/146 |
| EP | 0777379 A1 | 11/1995 | H04N/3/15 |
| EP | 08009391 | 1/1996 | H04N/9/04 |
| EP | 0 707 416 A2 | 4/1996 | H04N/3/15 |
| EP | 08095670 | 4/1996 | G06F/1/16 |
| EP | 0 777 379 A1 | 6/1997 | H04N/3/15 |
| EP | 0 854 516 A2 | 7/1998 | H01L/27/146 |
| JP | 59-152424 | 8/1959 | G03B/7/20 |
| JP | 54-108628 | 8/1979 | G03B/7/20 |
| JP | 58-83824 | 5/1983 | G03B/7/20 |
| JP | 59-42527 | 3/1984 | G03B/17/14 |
| JP | 60-23841 | 2/1985 | G03B/17/14 |
| JP | 60-53912 | 3/1985 | G02B/7/11 |
| WO | 96/15626 | 5/1996 | H04N/5/335 |
| WO | 97/17800 | 5/1997 | H04N/3/143 |
| WO | WO 99/66560 | 12/1999 | H01L/27/144 |
| WO | WO 99/66712 | 12/1999 | H04N/3/15 |
| WO | 00/72604 A1 | 11/2000 | H04N/9/04 |

OTHER PUBLICATIONS

Alex Dickinson, et al., "TP 13.5: A 256×256 CMOS Active Pixel Image Sensor With Motion Detection", IEEE International Solid–State Circuits Conference, 1995, pp. 226–227.

Carver A. Mead, et al. "Scanners For Visualizing Activity of Analog VLSI Circuitry", California Institute of Technology Computation and Neural Systems Program, Jul. 5, 1991, pp. 2–29.

Chye Huat Aw, et al. "A 128×128 Pixel Standard CMOS Image Sensor With Electronic Shutter", IEEE International Solid–State Circuits Conference, 1996, pp. 4–39 to 4–40.

Eric R. Fossum, "Active Pixel Sensors: Are CCD's Dinosaurs?", SPIE vol. 1900, 7/93, pp. 2–14.

Guang Yang, et al. "A Snap–Shot CMOS Active Pixel Imager For Low–Noise, High–Speed Imaging", IEEE, 1998, pp. 45–48.

Hon–Sum Philip Wong, "CMOS Image Sensors—Recent Advances and Device Scaling Considerations", IEDM, 1997 IEE, pp. 201–204.

Hon–Sum Philip Wong, et al. "CMOS Active Pixel Image Sensors Fabricated Using a 1.8–V 0.25–$\mu$m CMOS Technology", IEEE, Apr., 1998, pp. 889–894.

Orly Yadid–Pecht, et al. "A Random Access Photodiode Array for Intelligent Image Capture", IEEE Transactions on Electron Devices, vol. 38, No. 8, Aug. 1991, pp. 1772–1780.

R. Daniel McGrath, et al. "FA 11.2: Current–Mediated, Current–Reset 768×512 Active Pixel Sensor Array", IEEE Digest of Technical Papers, Feb. 7, 1997, pp. 182–183, 138–139.

R.M. Guidash, et al. "A 0.6 um CMOS Pinned Photodiode Color Imager Technology", IEDM, 1997, pp. 927–929.

R. Panicacci, "¼ Inch CMOS Active Pixel Sensor With Smart On–Chip Functions and Full Digital Interface, Part 1., Brief Introduction to CMOS Image Sensors", Hot Chips IX, Aug. 25–26, 1997, pp. 41–53.

Stephen John Decker, "A Wide Dynamic Range CMOS Imager with Parallel On–Chip Analog–to Digital Conversion", Submitted to the Department of Electrical Engineering and Computer Science at Massachusetts Institute of Technology, Sep. 1997, pp. 3–205.

Sunetra K. Mendis, et al. "A 128×128 CMOS Active Pixel Image Sensor for Highly Integrated Imaging Systems", IEEE, 1993, pp. 583–586.

T. Delbruck, et al. "Analog VLSI Adaptive, Logarithmic, Wide–Dynamic–Range Photoreceptor", IEEE, May 1994, pp. 4 pages.

Tatsuo Nomoto, et al. "FA 11.4: A 4M–Pixel CMD Image Sensor With Block and Skip Access Capability", IEEE International Solid–State Circuits Conference, 1997, 6 pages.

Yoshiaki Hagiwara, "High–Density and High–Quality Frame Transfer CCD Imager With Very Low Smear, Low Dark Current, and Very High Blue Sensitivity", IEEE Transactions on Electron Devices, vol. 43, No. 12, Dec. 1996, pp. 2122–2130.

J.E.D. Hurwitz, et al. "An 800K–Pixel Color CMOS Sensor For Consumer Still Cameras", SPIE vol. 3019, 1997, pp. 115–124.

Akihiro Nitayama, et al., "Future Directions for DRAM Memory Cell Technology", Microelectronics Engineering Laboratory, Toshiba Corp., Japan.

David X.D. Yang, et al., "A 640×512 CMOS Image Sensor With Ultrawide Dynamic Range Floating–Point Pixel–Level ADC", Journal of Solid State Circuit, vol. 34, No. 12, Dec. 1999, pp. 1821–1834.

David X.D. Yang, et al., "A Nyquist Rate Pixel Level ADC for CMOS Image Sensors", IEEE Journal of Solid State Circuits, vol. 34, No. 3 Mar. 1999, pp. 348–356.

David X.D. Yang, et al., "A 128×128 Pixel CMOS Area Image Sensor With Multiplexed Pixel Level A/D Conversion", Information Systems Laboratory, Electrical Engineering Dept., Stanford University.

Boyd Fowler, et al., "Techniques For Pixel Level Analog to Digital Conversion", Information Systems Laboratory, Stanford University.

Boyd Fowler, et al., "A CMOS Area Image Sensor With Pixel Level A/D Conversion", Information Systems Laboratory, Electrical Engineering Department, Stanford University, Nov. 20, 1995.

Buried Triple p–n Junction Structure in a BICMOS Technology for Color Detection, Chouikha, et al., XP–000801004, 1997, pp. 108–111.

A 100 Frame(s) CMOS Active Pixel Sensor for 3D–Gesture Recognition System, Miura, et al., XP–002141461, ISSCC99, Session 7, 1999, pp. 142–143.

Physics of Semiconductor Devices, S.M. Sze, Division: John Wiley & Sons, Inc., 1969.

Noise Performance of a Color CMOS Photogate Image Sensor, Blanksby, et al., 1997.

Electrically Erasable & Reprogrammable Read–Only Memory Using the n–Channel SIMOS One–Transistor Cell, Bernward Rossler, 1976.

A 256×256 CMOS Imaging Array with Wide Dynamic Range Pixels and Column–Parallel Digital Output, Decker, et al., Session 11, 1998.

* cited by examiner

ACTIVE PIXEL SENSOR WITH BOOTSTRAP AMPLIFICATION AND REDUCED LEAKAGE DURING READOUT

RELATED APPLICATIONS

This application is a continuation-in-part of application Ser. No. 09/099,116, filed Jun. 17, 1998, now U.S. Pat. No. 6,097,022 assigned to the same assignee as the present invention.

BACKGROUND OF THE INVENTION

1. Field of the Invention

The present invention relates to active pixel sensors. More particularly, the present invention relates to variable biasing of several of the transistors in an active pixel sensor to improve sensitivity, reduce noise, to provide compressive non-linearity in the charge-to-voltage gain, and to reduce leakage current in pixels during readout.

2. The Prior Art

In the art of CMOS active pixel sensors, the sensitivity, noise, and nature of the gain of an active pixel sensor present issues of concern. The sensitivity of an active pixel sensor in measuring the charge generated by the photons striking the active pixel sensor is typically characterized by determining the volts generated per photon of light striking the active pixel sensor and is termed charge-to-voltage gain. The readout amplifier in an active pixel sensor represents a substantial source of noise that in prior art pixel sensors has required design tradeoffs. The gain in prior art active pixel sensors is most often expansive, though it is preferred to be compressive.

The sensitivity of an active pixel sensor is determined by at least three factors. The first factor is related to the percentage of the area in the active pixel sensor available for converting photons to electrons. This is known as the fill factor. An increase in the area leads to an increase in the amount of charge generated. A second factor affecting the sensitivity of the active pixel sensor is related to the capacitance that is available for the integration of the charge sensed by the active pixel sensor. It will be appreciated that the voltage on the capacitor for given amount of charge is inversely proportional to the size of the capacitor. Accordingly, when the capacitance increases, the voltage decreases for the same amount of charge. A third factor is the gain of the readout amplifier for the active pixel sensor. Since the readout amplifier in the prior art is typically a transistor configured as a source follower, the gain is less than one.

One source of noise in an active pixel sensor is created by threshold fluctuations in the readout transistor. The amount of threshold fluctuation is related to the size of the readout transistor. As the size of the readout transistor is increased, the amount of threshold fluctuation, and hence the amount of noise decreases.

In compressive nonlinear gain, the gain at high light levels is less than the gain at low light levels. Those of ordinary skill in the art will appreciate that it is typically desirable to have greater sensitivity in converting photons-to-voltage at lower rather than higher light levels, because this increases the signal-to-noise ratio at lower light levels and, accordingly, the usable dynamic range of the active pixel sensor is increased.

The CMOS active pixel sensor art includes active pixel sensors that may or may not have embedded storage. FIGS. 1 and 3 illustrate typical CMOS active pixel sensors without and with embedded storage, respectively.

In an active pixel sensor 10 of FIG. 1, a photodiode 12 employed to collect charge has an anode coupled to a fixed voltage potential, shown as ground, and a cathode coupled to the source of an MOS N-channel Reset transistor 14 and the gate of an MOS N-Channel Source-Follower transistor 16. The gate of MOS N-channel Reset transistor 14 is coupled to a RESET line, and the drain of MOS N-channel Reset transistor 14 is coupled to a voltage reference, Vref. The drain of MOS N-channel Source-Follower transistor 16 is coupled to a fixed potential Vcc, and the drain of MOS N-channel Source-Follower transistor 16 is coupled to an MOS N-Channel Row-select transistor 18. MOS N-Channel Row-select transistor 18 couples the active pixel sensor 10 to a row-select line 20 and a column output line 22 of an array of active pixel sensors. Typically, the voltage Vref and the voltage Vcc are the same. In the active pixel sensor 10, the capacitance available for the integration of the charge sensed by the active pixel sensor 10 includes the photodiode 12 capacitance and the gate capacitance of the MOS N-Channel Source-Follower transistor 16.

The operation of the active pixel sensor 10 as it is typically performed is well understood by those of ordinary skill in the art. FIG. 2 is a timing diagram illustrating the operation of active pixel sensor 10. The active pixel sensor 10 is first reset by a RESET signal, during a reset step, that turns on MOS N-Channel Reset transistor 14 to place the voltage Vref on the cathode of the photodiode 12. An integration step begins when the RESET signal is de-asserted (makes a transition from HIGH to LOW) after which photo-generated electrons are collected on the cathode of the photodiode 12 and reduce its voltage from the value Vref placed there during the reset step. During a subsequent readout step, a ROW SELECT signal will be asserted on row-select line 20 to turn on MOS N-Channel Row-select transistor 18 to place the voltage at the source of MOS N-Channel Source-Follower transistor 16 on the column output line 22 for sensing. It should be appreciated that the voltage on the gate of MOS N-Channel Source-Follower transistor 16 formed by the charge accumulated on the cathode of the photodiode 12 will be followed by the source of MOS N-Channel Source-Follower transistor 16 during the readout period.

FIG. 3 is a schematic diagram of a CMOS active pixel sensor 30 having embedded storage. As in the active pixel sensor 10 of FIG. 1, the active pixel sensor 30 of FIG. 3 includes a photodiode 12 having an anode that is coupled to ground and a cathode that is coupled to the source of MOS N-channel Reset transistor 14. The gate of MOS N-channel Reset transistor is coupled to a RESET line, and the drain of MOS N-channel Reset transistor 14 is coupled to a voltage Vref. The cathode of photodiode 12 is also coupled to the gate of MOS N-channel Source-Follower transistor 16. The drain of MOS N-channel Source-Follower transistor 16 is coupled to Vcc, and the source of MOS N-channel Source-Follower transistor 16 is coupled to MOS N-channel Row-select transistor 18. Typically, the voltage Vref and the voltage Vcc are equal to one another. As in the active pixel sensor of FIG. 1, MOS N-Channel Row-select transistor 18 couples the active pixel sensor 10 to a row-select line 20 and a column output line 22 of an array of active pixel sensors. In the active pixel sensor 30 of FIG. 3, the cathode of photodiode 12 is coupled to the MOS N-Channel Source-Follower transistor 16 through MOS N-channel Transfer transistor 32. The gate of MOS N-channel Transfer transistor 32 is coupled to a XFR line, and the drain of MOS N-channel Transfer transistor 32 is coupled to a first plate of a capacitor 34 and to the gate of MOS N-channel Source-Follower transistor 16.

In the active pixel sensor 30 of FIG. 3, the capacitance available for the integration of the charge sensed by the active pixel sensor 30 includes the capacitance of the photodiode 12, the capacitance of the storage capacitor 34, and the gate capacitance of the MOS N-Channel Source-Follower transistor 16. It should be appreciated, however, that because the voltage at the drain of the MOS N-Channel Source-Follower transistor 16 is high, the gate capacitance of the MOS N-Channel Source-Follower transistor 16 is small and is thus not typically a preferred charge storage element.

FIG. 4 is a timing diagram corresponding to the operation of active pixel sensor 30. To operate the active pixel sensor 30, the MOS N-channel transistor 14 is first turned on by a RESET signal to place the voltage Vref at the cathode of the photodiode 12 just as in the active pixel sensor of FIG. 1. The MOS N-channel Transfer transistor 32 is also turned on by a XFR signal asserted on the XFR line at this time to place the voltage Vref on the storage capacitor 34. MOS N-channel Reset transistor 14 is then turned off while MOS N-channel Transfer transistor 32 remains on, and the integration of photons striking the photodiode 12 begins. Since the MOS N-channel Transfer transistor 32 is still turned on, the storage capacitor 34 adds to the capacitance of the photodiode 12 during integration. This increases the charge capacity and therefore, the intensity (dynamic) range of the storage pixel sensor 30. The integration period is the period between the falling edge of the RESET signal and the falling edge of the XFR signal. At the end of the integration period, the MOS N-channel Transfer transistor 36 is turned off. During a subsequent readout phase of operation, MOS N-channel Row-select transistor 18 is turned on so that the voltage at the gate of the MOS N-channel Source-Follower transistor 16 will be followed by its source to be placed on the column output line 22.

In both active pixel sensors 10 and 30, the area provided to the photodiodes 12 can be made larger to improve the sensitivity by increasing the fill factor, and reducing the area for capacitance by minimizing the gate area of the MOS N-channel Source-Follower transistors 16. Unfortunately, when the gate capacitances of the MOS N-channel Source-Follower transistors 16 in active pixel sensors 10 and 30 are reduced, the noise in the MOS N-channel Source-Follower transistors 18 in both embodiments increases by an amount that is approximately inversely proportion to the gate areas of the MOS N-Channel Source-Follower transistors 16. Therefore the noise increases when the gate areas of both the MOS N-Channel Source-Follower transistors 16 are decreased, and decreases when the gate area of the MOS N-Channel Source-Follower transistors 16 increased.

In the case of the active pixel sensor 30 of FIG. 3 including the storage capacitor 34 as a separate element, the sensitivity and noise issues become more acute. The sensitivity is reduced because the presence of storage capacitor 34 further reduces the fill factor. The noise is increased because the presence of storage capacitor 34 reduces the available space for the MOS N-Channel Source-Follower transistor 16, which must therefore be smaller.

Junction leakage current is a dominant factor in the noise performance of many pixel sensors. As pixel sensor size is scaled downward, electric field becomes a significant factor in junction leakage. In co-pending application Ser. No. 09/099,116, filed Jun. 17, 1998, now U.S. Pat. No. 6,097,022, assigned to the same assignee as the present invention, the electric field has been reduced by globally clocking all of the active pixel sensors in an array so that their storage nodes are high only during readout. While this does provide some advantage, there remains room for improvement in the operation of storage pixel sensors.

Accordingly, it is an object of the present invention to increase the sensitivity of active pixel sensors.

It is a further object of the present invention to decrease the noise associated with leakage in active pixel sensors.

It is yet another object of the present invention to compress the gain in active pixel sensors as the relative light intensity increases.

BRIEF DESCRIPTION OF THE INVENTION

According to the present invention, the sensitivity of an active pixel sensor is increased and the noise reduced by providing a pixel sensor having an increased fill factor and a larger Source-Follower transistor. Noise is also reduced by operating the pixel sensor in a mode designed to minimize the electric field component of junction leakage current. The gain of the active pixel sensor is compressive as the relative light intensity in an active pixel sensor increases. In the mode of operation of an array of active pixel sensors according to the present invention, the drains of the Source-follower transistors in a row of the array are pulsed high only when the row is being read.

According to a first embodiment of the present invention, an active pixel sensor comprises a photodiode connected in series with a Reset transistor between a source of fixed potential and a reference voltage such that the photodiode is reverse biased. The gate of the Reset transistor is coupled to a reset line. A Source-Follower transistor has a gate coupled to the cathode of the photodiode, a source output node, and a drain coupled to a switchable potential.

According to a second embodiment of the present invention, an active pixel sensor comprises a photodiode connected in series with a Reset transistor between a source of fixed potential and a reference voltage such that the photodiode is reverse biased. The gate of the Reset transistor is coupled to a reset line. A Transfer transistor is coupled between the cathode of the photodiode and the gate of a Source-Follower transistor. The gate of the Transfer transistor is coupled to a transfer line. The Source-Follower transistor has a source output node, and a drain coupled to a switchable potential.

In a method for operating an array of active pixel sensors according to the present invention, the voltage at the drains of the Source-Follower transistors in a single row of an active pixel sensor are held at a low level during the integration period of the active pixel sensor, and are brought to a high level or pulsed to a high level in sync with the row select signal during the readout period for that single row. As presently preferred, the row select signal has a controlled rise time to limit the dV/dt of the voltage on the driven column lines and thereby limit any image dependant voltage drop of the source follower drain high level.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
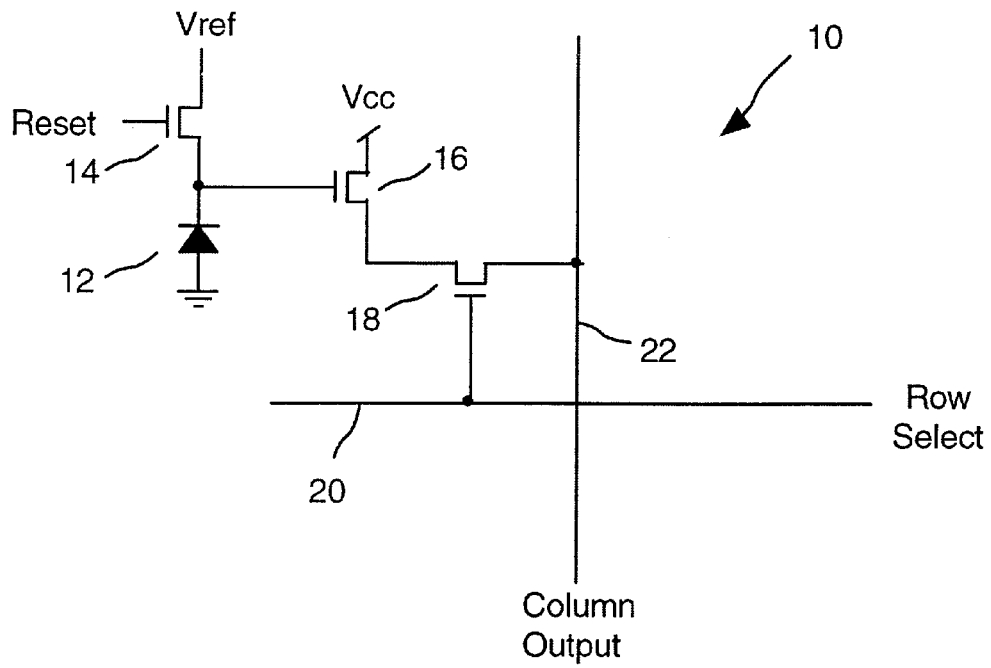
FIG. 1 is a simplified schematic diagram of a first known active-pixel sensor.
Figure 2:
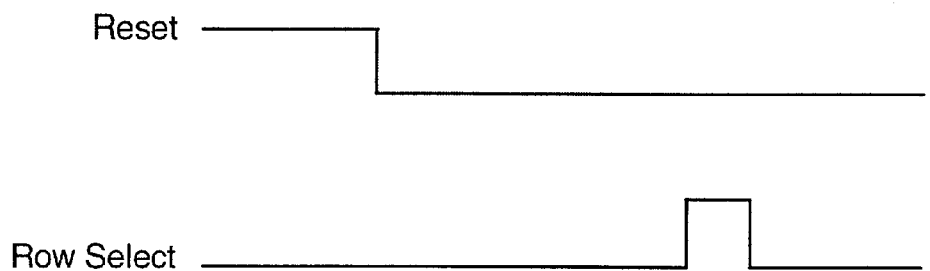
FIG. 2 is a timing diagram showing the operation of the active pixel sensor depicted in FIG. 1.
Figure 5:
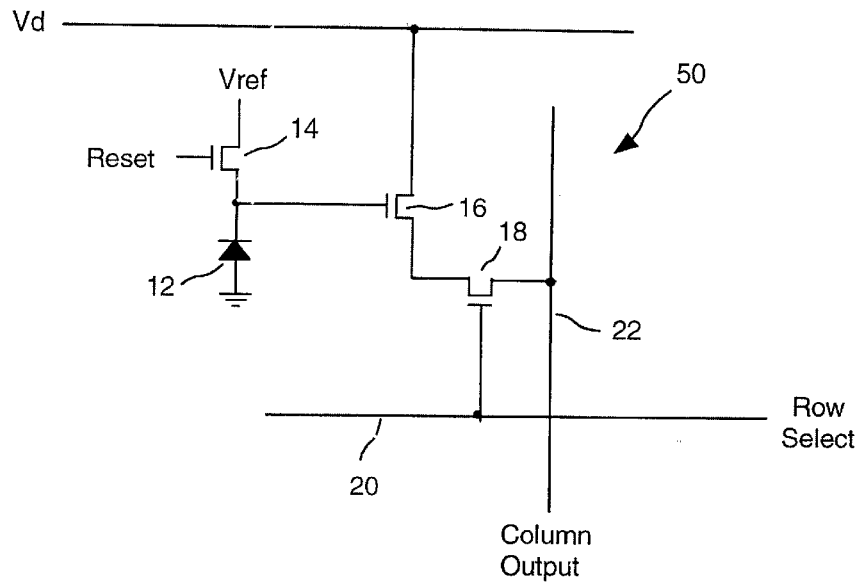
FIG. 5 is a simplified schematic of a first embodiment of an active-pixel sensor according to the present invention.

Referring now to FIG. 5, a first embodiment of an active pixel sensor 50 according to the present invention is depicted schematically coupled to a row select line and a column output line. The active pixel sensor depicted 50 in FIG. 5 is similar to the active pixel sensor of 10 FIG. 1, and accordingly, the same reference numerals are employed for corresponding elements in the two drawing figures. Thus active pixel sensor 50 includes photodiode 12 coupled in series with MOS N-Channel Reset transistor 14 between the fixed ground potential and the Vref voltage such that photodiode 12 is reverse biased. Active pixel sensor 50 of FIG. 3 differs from active pixel sensor 10 of FIG. 1 in the important aspect that the drain of the MOS N-Channel Source-Follower transistor 18 is connected to a switchable supply voltage Vd instead of a fixed drain supply voltage (Vcc in FIG. 1). Further, the voltage Vref may be a lower voltage than that encountered in the prior art.

Figure 6:
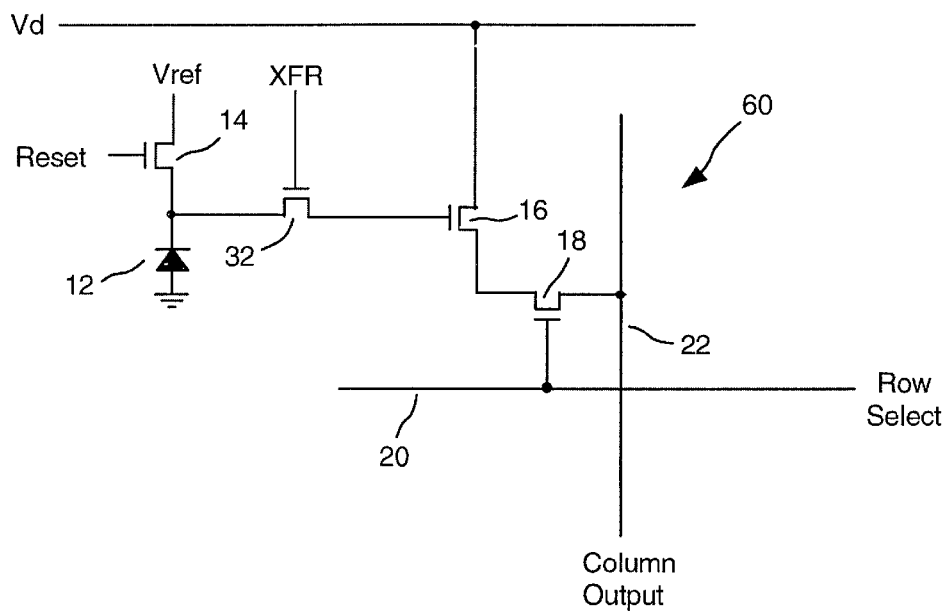
FIG. 6 is a simplified schematic of a second embodiment of an active-pixel sensor according to the present invention.

Referring now to FIG. 6, a second embodiment of an active pixel sensor 60 according to the present invention is depicted schematically coupled to a row select line and a column output line. The embodiment of FIG. 6 is very similar to the embodiment of FIG. 5, except that MOS N-Channel Transfer transistor 32 is coupled between the cathode of photodiode 12 and the gate of MOS N-Channel Source-Follower transistor 16. The gate of MOS N-Channel Transfer transistor 32 is coupled to a XFR signal line.

The pixel sensors 50 and 60 of the present invention provides an improved performance in the environment of an array in which pixel sensors 50 or 60 is usually encountered. This aspect of the present invention may be most easily seen with reference to FIG. 7, a block diagram of a portion of an array including plurality of rows of active-pixel sensors of FIG. 5, and FIG. 6, a timing diagram illustrating the operation of an array of pixel sensors 50.

Figure 7:
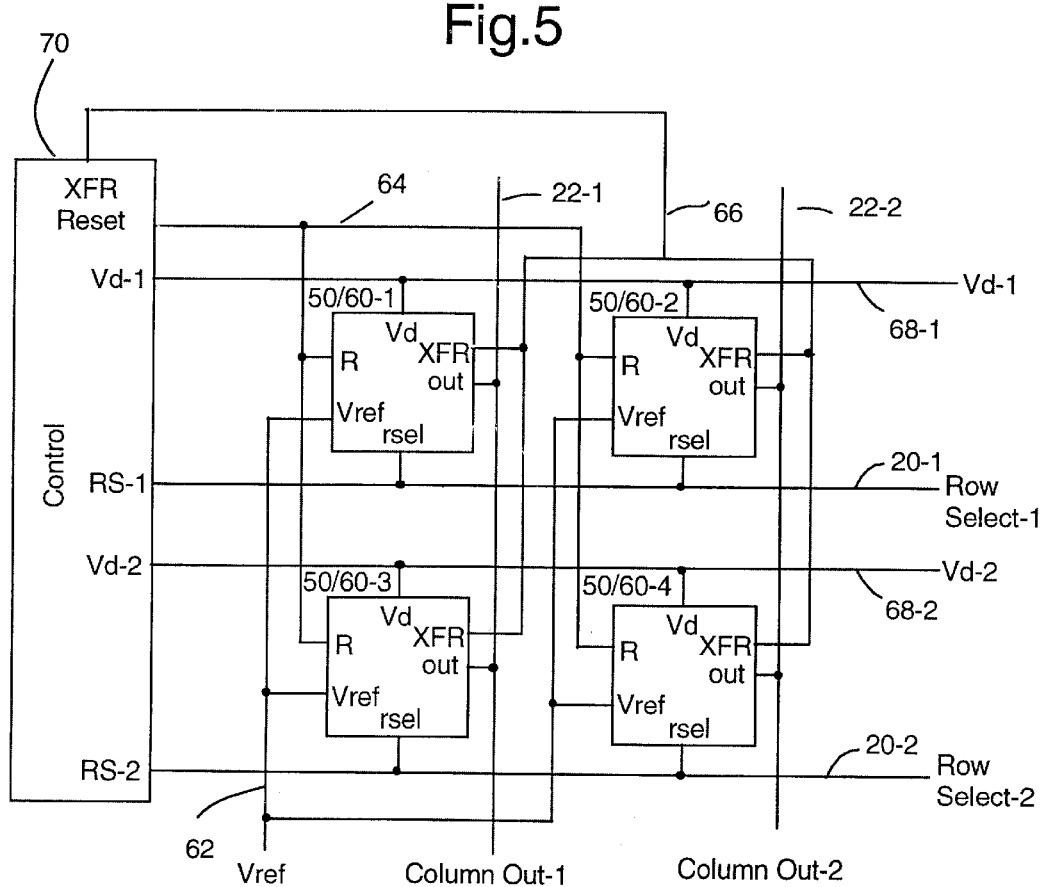
FIG. 7 is a block diagram of a portion of an array including plurality of rows of active-pixel sensors of either FIG. 5 or FIG. 6.

Array portion in FIG. 7 is shown as a 2×2 portion for illustrative purposes only. Persons of ordinary skill in the art will recognize that the array size for actual embodiments of the present invention will be arbitrary. The array portion can employ either the active pixel sensor 50 of FIG. 5 or 60 of FIG. 6. A first row of the array portion includes active pixel sensors 50/60-1 and 50/60-2. A second row of the array portion includes active pixel sensors 50/60-3 and 50/60-4. A first column of the array portion includes active pixel sensors 50-1 and 50/60-3. A second column of the array portion includes active pixel sensors 50/60-2 and 50/60-4.

As may be seen from FIG. 7, a common Vref line 62 is used for all active pixel sensors in the array. A common RESET line 64 is also used for all active pixel sensors in the array. A common XFR line 66 is also used for all active pixel sensors in the array. A first row select line 20-1 drives all active pixel sensors in the first row of the array. A second row select line 20-2 drives all active pixel sensors in the second row of the array. The outputs of all active pixel sensors in the first column of the array are driven onto first column output line 22-1. The outputs of all active pixel sensors in the second column of the array are driven onto first column output line 22-2. A first Vd line 68-1 drives all active pixel sensors in the first row of the array. A separate second Vd select line 68-2 drives all active pixel sensors in the second row of the array. When the the array portion contains active pixel sensors 60 of FIG. 6, an additional global XFR signal line is coupled to all active pixel sensors in the array.

A control circuit 70 is used to generate all of the signals used to control the operation of the array. As will be readily understood by persons of ordinary skill in the art, control circuit 70 will include well-known functional blocks such as clocks and timers, pulse generators, row decoders and other conventional logic to generate all of the signals shown in FIG. 8. This circuitry will differ depending on the size of the array. Particular configurations of this circuitry as a whole are not considered to be a part of the present invention and configuration of particular circuitry for use with particular embodiments of the invention is a trivial task for persons of ordinary skill in the art.

Figure 8:
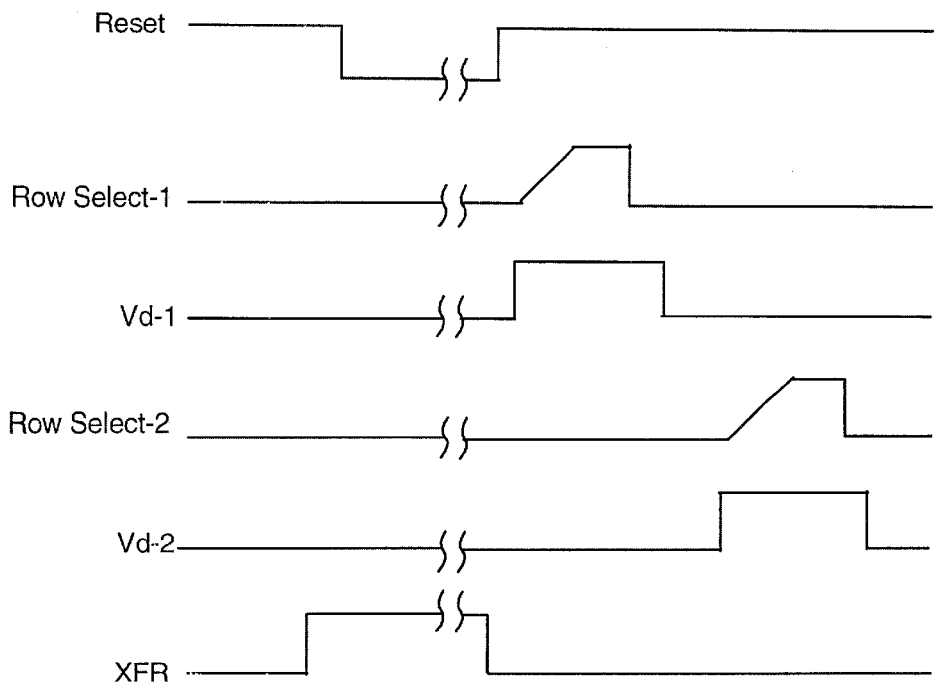
FIG. 8 is a timing diagram showing the operation of the array of active pixel sensors depicted in either FIG. 5 or FIG. 6.

FIG. 8 is a timing diagram depicting the operation of the array of active pixel sensors of the types shown in both FIGS. 5 and 6. In the operation of active pixel sensor 50, the RESET signal is first asserted at a HIGH level to turn on all of the MOS N-channel Reset transistors 14 (FIG. 5) in the array 60 to thereby set the cathodes of all photodiode 12 (FIG. 5) in the array to Vref during a reset period. When the RESET signal is de-asserted, the integration of photocharge begins wherein photo-generated electrons are collected on the cathodes of all photodiodes in the array. The integration of photocharge reduces the voltage on the cathodes of the photodiodes in the array from the value Vref at rates depending on the light levels at each pixel position in the array. The operation of active pixel sensor 60 is the same as that of active pixel sensor 50 with the additional feature that the global XFR line will be asserted prior to assertion of the RESET signal and be de-asserted at the end of the photo-integration period.

At the end of the integration period but before readout, RESET is again asserted high after the global XFR line has been de-asserted as shown in FIG. 8. During readout, a ROW SELECT signal will be asserted one at a time on each row-select line to turn on all of the MOS N-channel select transistors in the row to place the voltage at the source of each MOS MOS N-Channel Source-Follower transistor on the column output lines 22-1 and 22-2 for sensing. From an examination of FIG. 7, it will be observed that as each row is to be read, the Vd line for that row is first pulsed high, followed by assertion of the row-select line for that row. The row-select line is then de-asserted, followed by the end of the Vd pulse on the Vd line. It will be appreciated by persons of ordinary skill in the art that the voltages on the gates of each MOS N-channel Source-Follower transistor resulting from the charge accumulated on the cathode of its associated photodiode will be followed by the voltages at their sources during the readout period.

Figure 9:
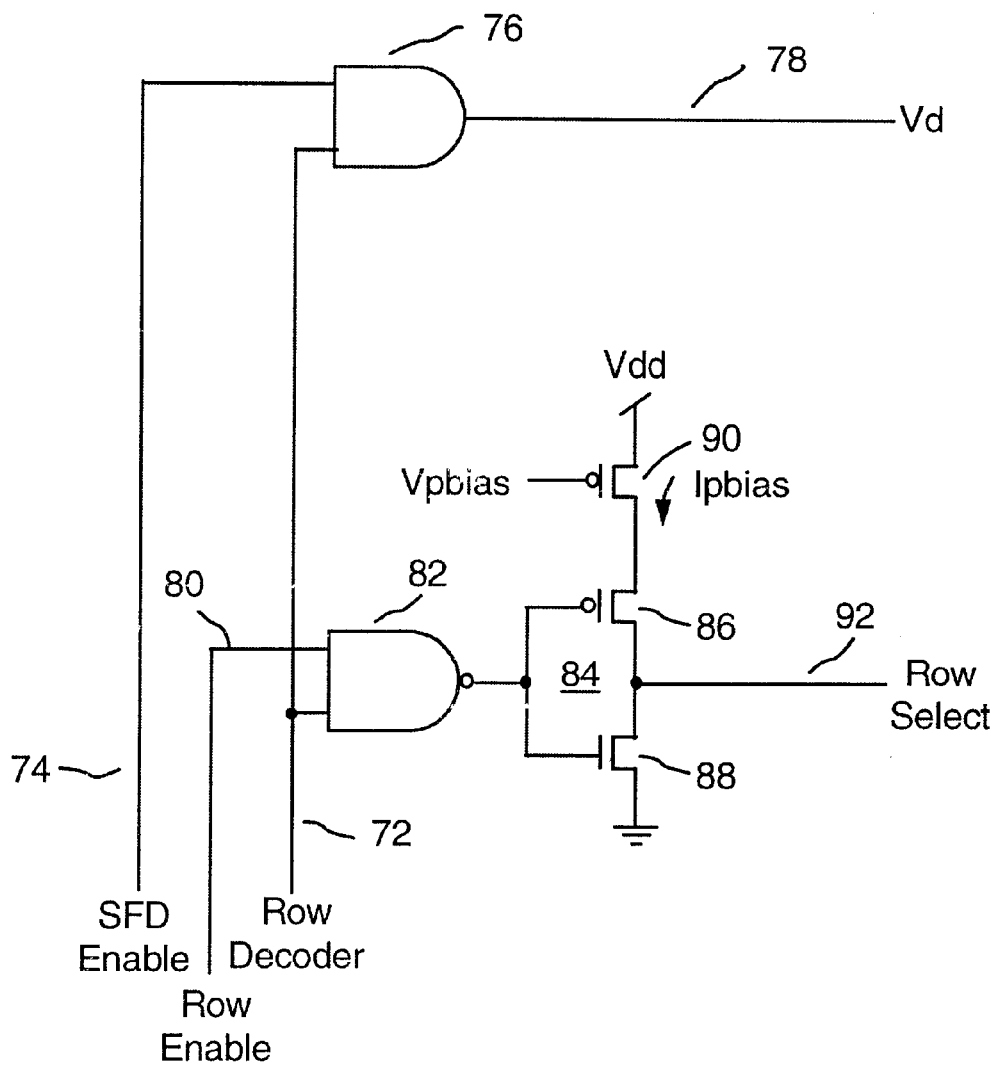
FIG. 9 is a schematic diagram of one example of a circuit that may be employed to control the rise time of the row select lines in an array of pixel sensors according to the present invention is shown.

According to one aspect of the present invention, it is preferred to control the rise time of the row-select signals. This controls the amount of current flowing into the column lines and prevents the creation of line stripe artifacts in the image being read from the array. Referring now to FIG. 9, a schematic diagram shows an exemplary decoder circuit for providing the Vd and row-select signals to one row of the array and includes one example of a circuit that may be employed to control the rise time of the row select lines in an array of pixel sensors according to the present invention.

Three control signals are used to drive the circuit of FIG. 9. The first signal, a row decoder output signal on row-decoder line 72, is the output from a row-decoder circuit that is used in the array to select individual rows for readout. The second signal, on SFD enable line 74, provides an enable signal that is ANDed with the row-decoder output signal on line 72 in AND gate 76, produces on output line 78 one of the signals Vd-1 or Vd-2 from the timing diagram of FIG. 8. The third signal, on row-enable line 78, is ANDed with the row-decoder output signal on line 72 in NAND gate 82. The output of NAND gate 82 is used to drive a current-starved inverter 84. The current-starved inverter 84 is formed from MOS P-Channel transistor 86 and MOS N-Channel transistor 88. The inverter 84 is current starved by providing the source voltage for P-Channel MOS transistor 86 through a P-Channel MOS bias transistor 90, having its gate coupled to a bias voltage source $V_{pbias}$. The output of current-starved inverter 84 produces one of the signals ROW SELECT-1 or ROW SELECT-2 from the timing diagram of FIG. 8. When the MOS P-Channel transistor 84 is turned on, the inverter will deliver a constant current equal to $I_{pbias}$. This constant current will provide a linear ramp voltage output as it charges the capacitiance of the ROW SELECT line 92.

The Vd output of AND gate 76 for each row in the array has to charge a total capacitance equal to the sum of the individual column line capacitances. At the extremes if all pixel sensors in the row were exposed to high light levels, each column would need to be charged up to a low voltage but if all pixel sensors in the row were exposed to low light levels, each column would need to be charged up to a higher voltage. In the case of low-light-level exposures, the total current drawn on the Vd line would be high. Because in an actual integrated circuit array the metal line carrying the Vd voltage has a resistance which could be typically 1,000 ohms and the output impedance of AND gate 76 might be even higher, this potentially could cause the Vd line voltage to droop at the source-follower drains and cause output signal-level errors, especially considering that an array could easily have 2,000 column lines to drive. According to this aspect of the present invention, the total current is limited by controlling the rise time of the signal that turns on the readout transistors coupled to the column lines.

The total driven column line capacitance is:

$$C_{tot} = N \times C_{col}$$

and the total current $I_{tot}$ is $$I_{tot} = C_{tot} \times \frac{dV_{col}}{dt}$$

or, since $V_{col}$ follows $V_{row}$ during charging and since $C_{row}$, the row-select line capacitance, is about equal to the column line capaciatnce $C_{col}$:

$$I_{tot} \approx C_{row} \times \frac{dV_{row}}{dt}$$

This is equivalent to:

$$I_{tot} \approx N \cdot I_{pbias}$$

In an array having 2,000 rows (N=2,000) the row drive current $I_{pbias}$ should be 2,000 times smaller than $I_{tot}$ (the $V_{SFD}$ drive current corresponding to negligible voltage drop).

As has been shown herein, the drains of the MOS N-channel Source-Follower transistors 16 are set to a first voltage level, preferably near ground, during the integration period, and then set to a second voltage level, preferably greater than Vref, during the readout period. Under these biasing conditions, the gates of the MOS N-Channel Source-Follower transistors 16 in active pixel sensors 50 operate as large nonlinear capacitors during the charge integration period, and as small and nearly linear capacitors during the readout period.

When the sources of the MOS N-channel Source-Follower transistors 16 are set near ground, the MOS N-channel Source-Follower transistors 16 will be turned on. When these devices are turned on, their gates provide a large capacitance. During integration, the large on-state capacitances at the gates of MOS N-channel Source-Follower transistors 16 are connected in parallel with, and therefore add to, the capacitance of the photodiodes 12. This increased capacitance decreases the charge-to-voltage gain during the integration period.

However, when the drains of MOS N-channel Source-Follower transistors 16 are brought high during the readout period, the change in the variable supply voltage Vd boosts the voltage on the gate via a "bootstrap" capacitive coupling effect well known to those of ordinary skill in the art, and the decrease in the charge-to-voltage gain realized during the integration period described above will typically be compensated for by the increased readout gain that comes from the bootstrapping dynamics when the drains of MOS N-Channel Source-Follower transistors 16 are brought high. This bootstrap effect provides a large operating range of the output signal voltages. Accordingly, the biasing scheme according to the present invention increases the sensitivity of the active pixel sensors.

Since the gates of MOS N-channel Source-Follower transistors 16 are boosted to a higher level during readout, a voltage Vref that is lower than that utilized in the prior art is preferred. As a consequence, the logic high voltage level on the RESET signal line may also be reduced when using active pixel sensors according to the present invention.

Figure 3:
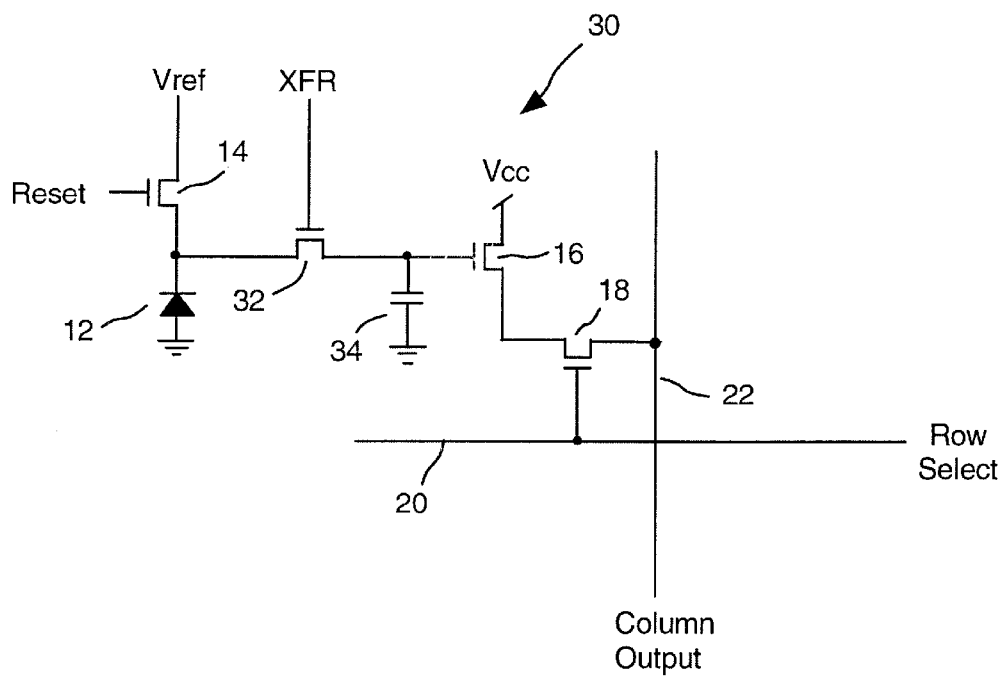
FIG. 3 is a simplified schematic diagram of a second known active-pixel sensor.
Figure 4:
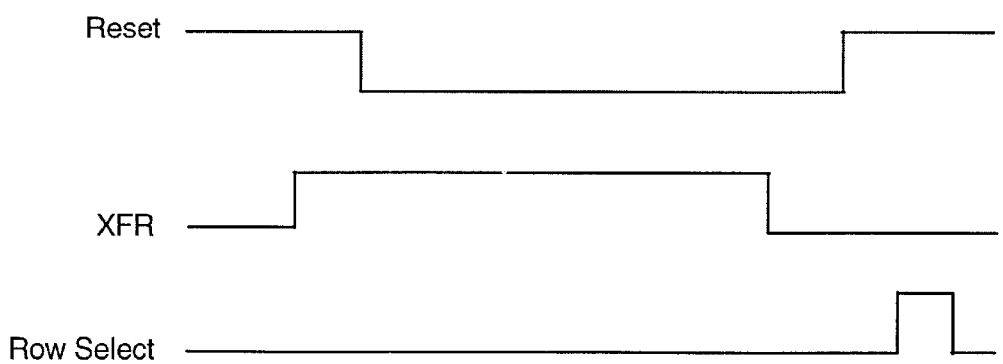
FIG. 4 is a timing diagram showing the operation of the active pixel sensor depicted in FIG. 3.

In contrast to the prior art, because the storage capacitor 34 shown in FIG. 3 has been eliminated from the active pixel sensor 60 as depicted in FIG. 6, the sensitivity of the active pixel sensor 60 may be increased by enlarging the area of the photodiode 32 without a loss of the photocharge generated, due to the large on-state capacitance of the gate of MOS N-channel Source-Follower transistor 16.

Since raising the variable supply voltage Vd to the drains of MOS N-channel transistors 16 and letting their sources settle upward causes the gate capacitances of MOS N-channel Source-Follower transistors 16 to change from a high capacitance to a low capacitance, it will be appreciated that there will be a corresponding redistribution of charge and voltage values within the active pixel sensors 50 and 60.

During the readout period of active pixel sensor 50 of FIG. 5, the photo-generated charge can no longer be held on the gate of MOS N-channel Source-Follower transistor 16, so it is held instead on the capacitance of photodiode 12. Since the net capacitance is lower, the charge-to-voltage gain is higher. The bootstrapping action can be viewed as reducing the capacitance to get a higher voltage signal on the photodiode 12, and then reading out that signal according to the gain of MOS N-channel Source-Follower transistor 16 operating as a source follower.

During the readout period of active pixel sensor 60 of FIG. 6, the effect of the bootstrap action is both beneficial and surprising. After accumulating charge during the integration period, the MOS N-channel Transfer transistor 32 is turned off by the control signal on the XFR line. When the gate capacitance of MOS N-channel Source-Follower transistor 16 becomes small during readout, the area to which the photo-generated charge may be redistributed is small. That is, the associated stray capacitance of the circuit node that includes the drain terminal of MOS N-channel Transfer transistor 32 and the gate terminal of MOS N-channel Source-Follower transistor 16 is quite small, compared to the photodiode 12 capacitance. This greatly reduced capacitance leads to an increased charge-to-voltage gain.

In the embodiment of FIG. 6, the limit on the achievable charge-to-voltage gain is determined by the linear combination of the voltage at the gate of MOS N-channel Source-Follower transistor 16, and the back-gate or substrate voltage of the MOS N-channel Source-Follower transistor 16 that is needed to place the MOS N-channel Source-Follower transistor 16 at threshold. The resulting conversion is a nearly linear function of the charge signal that was captured on the storage node at the gate of MOS N-Channel Source-Follower transistor 16.

It should be appreciated that when the column output line and the sources of the MOS N-channel Source-Follower transistors 16 settle, the MOS N-Channel read out transistors 18 will be near threshold. The voltage at the sources, taking into account the body effect, K, is expressed by the following relation:

$$V_S = \kappa(V_G - V_{Th})$$

Accordingly, the two unknowns, the source and the gate voltages of MOS N-channel Source-Follower transistors 16 are linearly related.

The expression of charge conservation at the gate of the MOS N-channel Source-Follower transistors 16, which provides a further constraint, is as follows:

$$(\Delta V_S - \Delta V_G)C_{GS} + (\Delta V_D - \Delta V_G)C_{GD} = \Delta V_G C_S$$

In this expression, assuming linear capacitances, the gate capacitance of MOS N-channel Source-Follower transistors 16 couple primarily to the sources when the drains of MOS N-channel Source-Follower transistors 16 and 40 are brought high so that the gate to source capacitance $C_{GS}$ dominates the gate to drain capacitance $C_{GD}$. The stray storage node capacitance is represented by $C_S$. Though this capacitance may be relevant, it may be small in the active pixel 60.

Defining a gate voltage $V_{GO}$ before bringing $V_D$ high, and a final gate voltage $V_G$, such that: $V_G = V_{GO} + \Delta_{VG}$, and assuming $V_D$ and $V_S$ are initially at ground so that $V_S = \Delta V_S$ and $V_D = \Delta V_D$, the bootstrapped gate voltage of MOS N-Channel Source-Follower transistors 16 may be expressed as:

$$V_G = \frac{V_{GO}(C_{GD} + C_{GS} + C_S) + \Delta V_D C_{GD} - \kappa V_{Th} C_{GS}}{C_{GD} + (1-\kappa)C_{GS} + C_S} - V_{Th}$$

As a result, the column output voltage may be expressed as the source voltage as follows:

$$V_s = \kappa \left( \frac{V_{GO}(C_{GD} + C_{GS} + C_S) + \Delta V_D C_{GD} - \kappa V_{Th} C_{GS}}{C_{GD} + (1-\kappa)C_{GS} + C_S} - V_{Th} \right)$$

This implies that the gain from the signal stored at the gate of MOS N-Channel Source-Follower transistors 16 to the column output during read out is expressed by the following relation:

$$\frac{dV_S}{dV_{GO}} = \frac{\kappa(C_{GD} + C_{GS} + C_S)}{C_{GD} + (1-\kappa)C_{GS} + C_S} \approx \frac{\kappa}{(1-\kappa)}$$

wherein the approximation holds for small values of $C_{GD}$ and $C_S$.

The linear conversion of captured charge to a final voltage on the column output line has two beneficial consequences. First, it means that a large capacitance value at the gate of MOS N-channel Source-Follower transistor 16 has a beneficial, rather than a harmful, effect on the overall gain, since a larger capacitance on that side of the MOS N-channel Transfer transistor 32 means that a larger fraction of the photocharge is captured, as opposed to being wasted charging the photodiode 12 itself. The overall gain will typically exceed even the gain of the photodiode 12 without any additional capacitive loading. Therefore, increasing the MOS N-channel Source-Follower transistor 40 size to reduce noise will not substantially reduce the gain.

Second, the linear conversion from captured charge to output voltage can lead to a beneficial compressive nonlinearity as follows. As photocharge is accumulated, the gate of MOS N-channel Source-Follower transistor 16 will fall in voltage until at some point it falls below a threshold voltage, at which point the gate capacitance will change from high to low. Further photocharge will accumulate primarily on the photodiode 12 capacitance only, so the voltage at the gate of MOS N-channel Source-Follower transistor 16 will fall more quickly. This charge-to-voltage break-point nonlinearity during integration is expansive, not compressive, but nonetheless leads surprisingly to a compressive break-point nonlinearity in the overall gain. When the MOS N-channel Transfer transistor 32 is turned off, the proportion of charge stored on the storage side of the MOS N-channel Transfer transistor 32 is reduced at high light levels, since more of that charge is kept on the photodiode 12 instead. Hence the integrated image signal voltage responds expansively during integration, yet a linear readout of the stored charge responds compressively.

Figure 10:
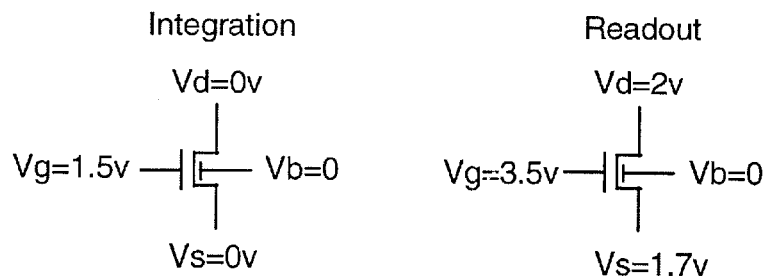
FIG. 10 is a schematic diagram that illustrates the gate, drain, source, and back-gate voltages in a Source-Follower transistor during integration and readout in first example according to the present invention.
Figure 11:
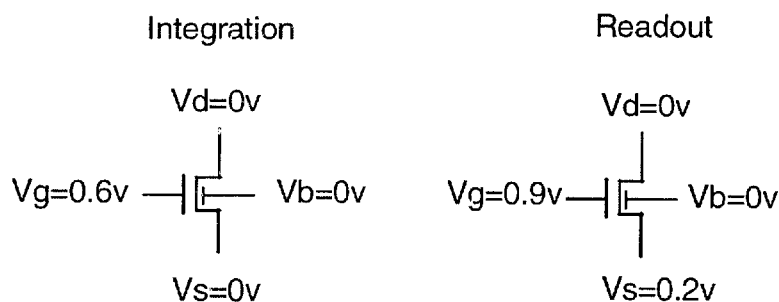
FIG. 11 is a schematic diagram that illustrates the gate, drain, source, and back-gate voltages in a Source-Follower transistor during integration and readout in second example according to the present invention.
Figure 12:
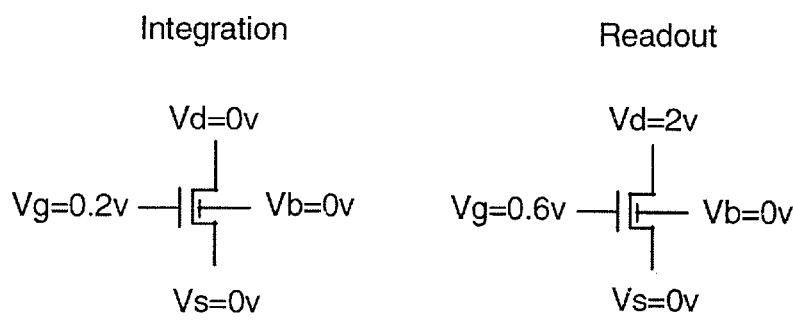
FIG. 12 is a schematic diagram that illustrates the gate, drain, source, and back-gate voltages in a Source-Follower transistor during integration and readout in third example according to the present invention.

Turning now to FIGS. 10, 11, and 12, examples of the voltages found on MOS N-Channel Source-Follower transistors during the integration period and readout periods for different light intensities are illustrated. In FIGS. 10, 11, and 12, the voltages correspond to increasing intensity conditions, as the light goes from darker to a lighter.

As depicted in FIGS. 10, 11, and 12, during the integration period, the voltage at both the drain and the source of the Source-Follower transistor are both at ground, and by convention the substrate or back-gate potential is also referred to as ground. In FIGS. 10, 11, and 12, the voltages at the gate of the Source-Follower transistor at the end of the integration period are 1.5, 0.6, and 0.2 volts, respectively. Since, in this example, the Vref to which the photodiode is initially set is 1.5 volts, the 1.5 volts at the gate of the Source-Follower transistor in FIG. 10 corresponds to a darker condition than the 0.6 volts at the gate of the Source-Follower transistor in FIG. 11, and the 0.2 volts at the gate of the Source-Follower transistor in FIG. 12 corresponds to a lighter condition than the 0.6 volts at the gate of the Source-Follower transistor in FIG. 11.

During the readout period illustrated in FIGS. 10, 11, and 12, the voltage at the drain of the Source-Follower transistor is raised by 2 volts. It can be observed that as a result, the voltage at the gate of the Source-Follower transistor has increased in each of the three examples. In FIG. 10, a comparison of the gate voltage at the end of the integration period with the gate voltage during the readout period reveals that the voltage at the gate has gone from about 1.5 volts to about 3.15 volts. In FIG. 11, a comparison of the gate voltage at the end of the integration period with the gate voltage during the readout period reveals that the voltage at the gate has gone from about 0.6 volts to about 0.9 volts. In FIG. 12, a comparison of the gate voltage at the end of the integration period with the gate voltage during the readout period reveals that the voltage at the gate has gone from about 0.2 volts to about 0.6 volts. The increase at the gate in these examples is a result of the bootstrap amplification that takes place due to capacitive coupling between the drain and the gate of the Source-Follower transistor. This increase is generally an amount that is less than the amount that the source of the Source-Follower transistor is increased, unless the gate-drain overlap capacitance is significant.

In the examples shown in FIGS. 10, 11, and 12, the value of kappa, κ, described above is two-thirds, and $V_{Th}$ is 0.6 volts. In accordance with the above discussion, the output source voltage will settle such that two-thirds of the gate-to-source voltage, $V_{GS}$, added to one-third of the bulk-to-source voltage, $V_{BS}$, will be equal to approximately 0.4 volts. In FIGS. 10, 11, and 12, during the readout period, this provides a source voltages of 1.7, 0.2, and nearly 0 volts, respectively.

Figure 13:
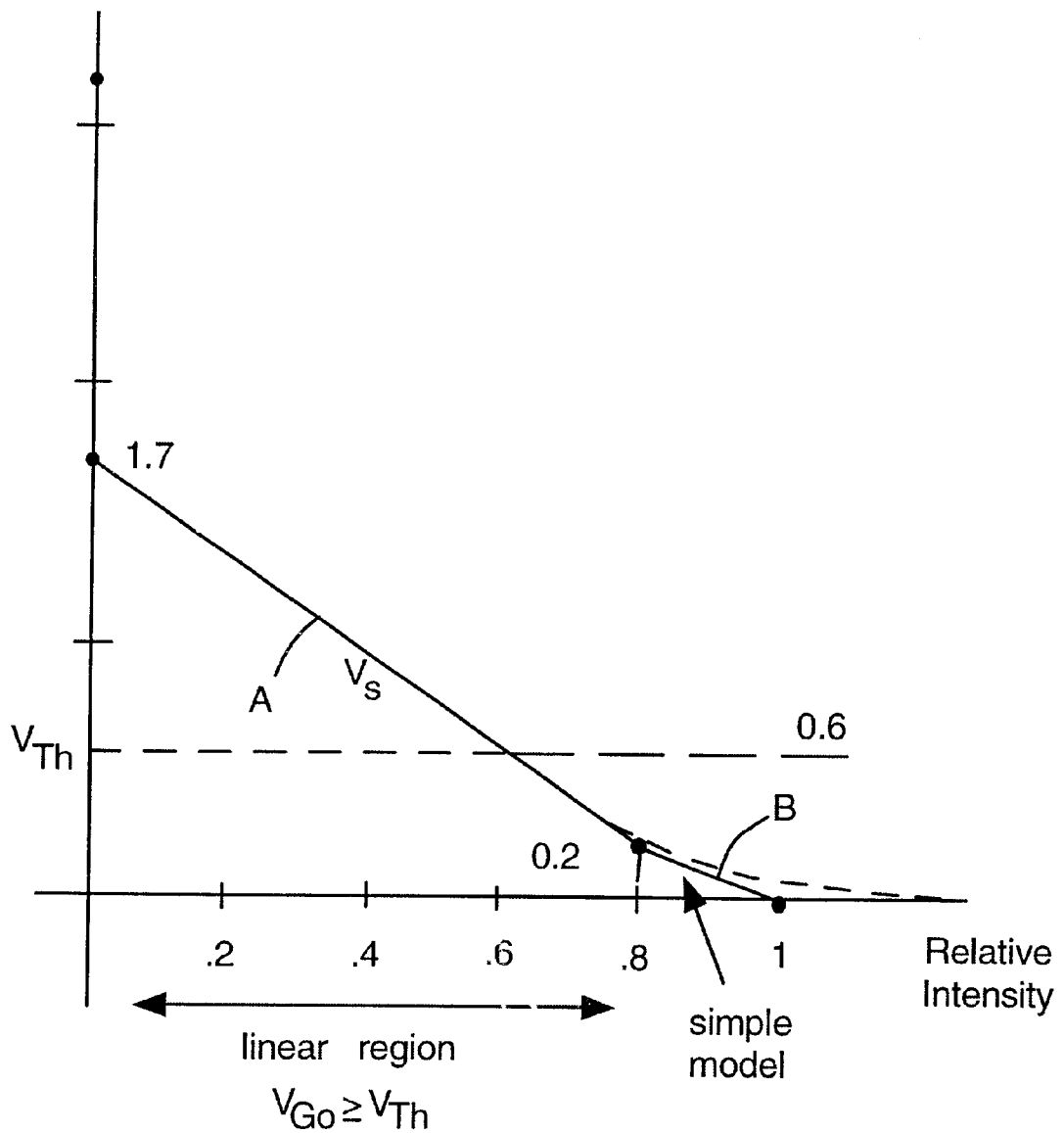
FIG. 13 is a graph that illustrates compression in the gain of an active pixel sensor as the relative light intensity increases according to the present invention.

In FIG. 13, the voltages depicted for the differing light conditions in FIGS. 10, 11, and 12 for the gate during both integration and readout and for the source during readout are illustrated graphically. From FIG. 13, those of ordinary skill in the art will readily appreciate that according to the present invention, the gain is compressed as the relative intensity in the light increases. This can be observed from the graph of the voltage Vg at the gate during readout by comparing area A in the graph with area B in the graph. Area A of the graph of Vg has a first slope, and area B of the graph of Vg has a second slope such that the slope of area B has an absolute value that is less than the absolute value of the slope in area A. This change in the slope of the graph of Vg as the relative light intensity increases corresponds to a compression in the gain.

The leakage of charge that can potentially degrade the signal stored at the gate capacitance of transistor 16 (in FIG. 6) is dominated by junction leakage at the drain of transfer transistor 32. Since this leakage tends to be a very expansive function of voltage, it is an advantage to keep the voltage low for as much of the time as possible. Hence the current invention avoids raising the voltage by bootstrapping except on the one row being read out at any given time.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated active pixel sensor array arranged in a plurality of rows and columns comprising:

a plurality of row select lines, each of said row select lines associated with one row in the array and coupled to a source of a row-select signal;

a plurality of source-follower drain row lines, each of said source-follower drain row lines associated with one row in said array and coupled to a source of a source-follower drain row signal;

a plurality of column output lines, each of said column lines associated with one column in said array;

a reset line coupled to a source of a reset signal;

a source of reset potential; and a plurality of active pixel sensors, each pixel sensor associated with one row and one column of the array and including a photodiode having a first terminal coupled to a first reference potential and a second terminal, a Reset transistor having a gate coupled to said reset line, a drain coupled to said reset potential that reverse biases said photodiode, and a source coupled to said second terminal of said photodiode, a Source-Follower transistor having a gate coupled to said second terminal of said photodiode, a drain connected to the one of said plurality of source-follower drain row lines with which its active pixel sensor is associated, and a source, a Row-select transistor having a gate coupled to the one of said plurality of row-select lines with which its active pixel sensor is associated, a drain coupled to said source of said Source-follower transistor, and a source coupled to the one of said plurality of column output lines with which its active pixel sensor is associated.

2. A method for operating an integrated active pixel sensor array as in claim 1 comprising:

asserting a RESET signal on said reset line during a reset period;

integrating photocharge on said plurality of active pixel sensors during an integration period;

reading out signals representing integrated photocharge from said plurality of active pixel sensors one row at a time by selecting a row for readout, asserting the one of said source-follower drain row lines associated with the selected row, and, while said one of said source-follower drain row lines associated with the selected row is asserted, asserting the one of said row select lines associated with the selected row.

3. The method of claim 2 wherein asserting the one of said row select lines associated with the selected row comprises raising the voltage on said one of said row select lines associated with the selected row with a controlled rise time.

4. An integrated active pixel sensor array arranged in a plurality of rows and columns comprising:

a plurality of row select lines, each of said row select lines associated with one row in the array and coupled to a source of a row-select signal;

a plurality of source-follower drain row lines, each of said source-follower drain row lines associated with one row in said array and coupled to a source of a source-follower drain row signal;

a plurality of column output lines, each of said column lines associated with one column in said array;

a reset line coupled to a source of a reset signal;

a transfer line coupled to a source of a transfer signal;

a source of reset potential; and a plurality of active pixel sensors, each pixel sensor associated with one row and one column of the array and including a photodiode having a first terminal coupled to a first reference potential and a second terminal, a Reset transistor having a gate coupled to said reset line, a drain connected to said reset potential that reverse biases said photodiode, and a source coupled to said second terminal of said photodiode, a Transfer transistor having a gate coupled to said transfer line, a source coupled to said second terminal of said photodiode, and a drain, a Source-Follower transistor having a gate coupled to said source of said Transfer transistor, a drain coupled to the one of said plurality of source-follower drain row lines with which its active pixel sensor is associated, and a source, a Row-select transistor having a gate coupled to the one of said plurality of row-select lines with which its active pixel sensor is associated, a drain coupled to said source of said Source-follower transistor, and a source coupled to the one of said plurality of column output lines with which its active pixel sensor is associated.

5. A method for operating an integrated active pixel sensor array as in claim 4 comprising:

asserting a reset signal on said reset line during a reset period;

asserting a transfer signal on said transfer line during said reset period and during an integration period;

integrating photocharge on said plurality of active pixel sensors during said integration period;

de-asserting said transfer signal on said transfer line; and reading out signals representing integrated photocharge from said plurality of active pixel sensors one row at a time by selecting a row for readout, asserting the one of said source-follower drain row lines associated with the selected row, and, while said one of said source-follower drain row lines associated with the selected row is asserted, asserting the one of said row select lines associated with the selected row.

6. The method of claim 5 wherein asserting the one of said row select lines associated with the selected row comprises raising the voltage on said one of said row select lines associated with the selected row with a controlled rise time.

* * * * *